United States Patent [19]

Tomita et al.

[11] Patent Number: 4,906,347

[45] Date of Patent: Mar. 6, 1990

[54] DRY-ETCHING APPARATUS

[75] Inventors: Kazuyuki Tomita, Osaka; Masuo Tanno, Hirakata; Yasuo Tanaka, Kadoma, all of Japan

[73] Assignee: Matsushita Electric Industrial Co., Ltd., Kadoma, Japan

[21] Appl. No.: 228,217

[22] Filed: Aug. 4, 1988

[30] Foreign Application Priority Data

Aug. 5, 1987 [JP] Japan ................................ 62-195914

[51] Int. Cl.$^4$ ............................................. C23F 4/00
[52] U.S. Cl. ............................. 204/298; 204/192.32; 156/345; 156/643
[58] Field of Search ................ 204/192.32, 298 EE, 204/298 MM; 156/345, 643

[56] References Cited

U.S. PATENT DOCUMENTS 4,631,106 12/1986 Nakazato et al. .................... 156/345

FOREIGN PATENT DOCUMENTS 62-89864 4/1987 Japan .......................... 204/298 MM
63-53261 3/1988 Japan .......................... 204/298 MM

*Primary Examiner*—Aaron Weisstuch
*Attorney, Agent, or Firm*—Cushman, Darby & Cushman

[57] ABSTRACT

The magnetron dry-etching apparatus has, behind its anode electrode (1) facing an object to be etched positioned on a cathode electrode (2), a rotatable magnet assembly comprising at least one pair of rotatable permanent magnets (12) of narrow-pie-shape, fixed on a common yoke (14) so that different polarity magnetic poles (N and S) are disposed side by side; whereby a uniform magnetic field is formed on a wafer (8) on the cathode (2) upon rotation of said magnet assembly, thereby assuring uniform etching even upon change of gas pressure of other etching conditions.

1 Claim, 7 Drawing Sheets

FIG.2 (a)(Prior Art)
20 mtorr
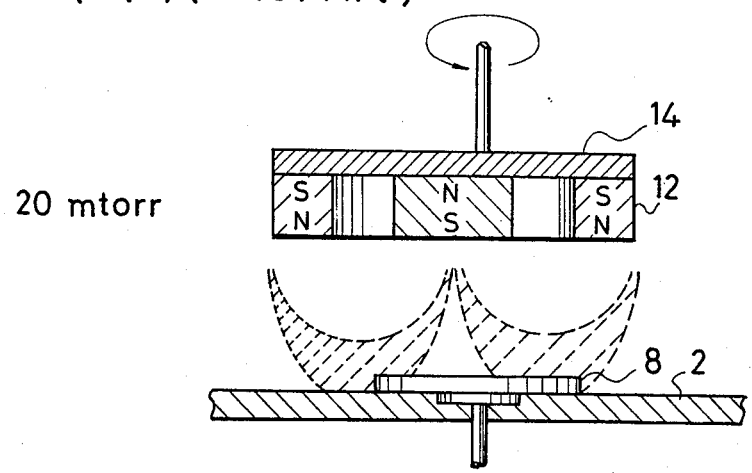
FIG.2(b)(Prior Art)
50 mtorr
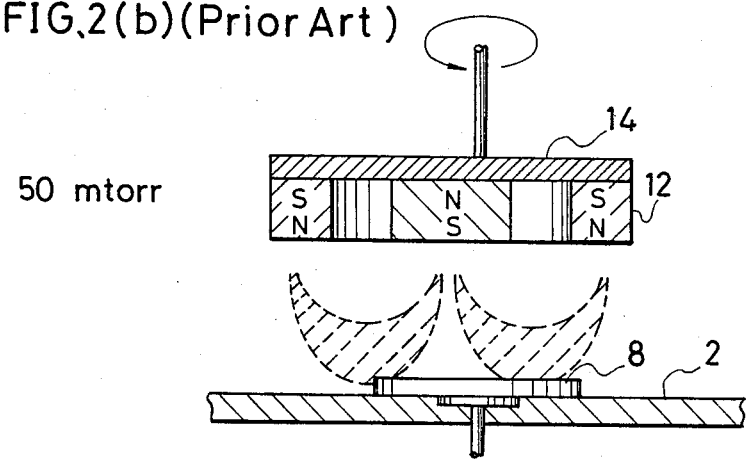
FIG.2(c)(Prior Art)
100 mtorr
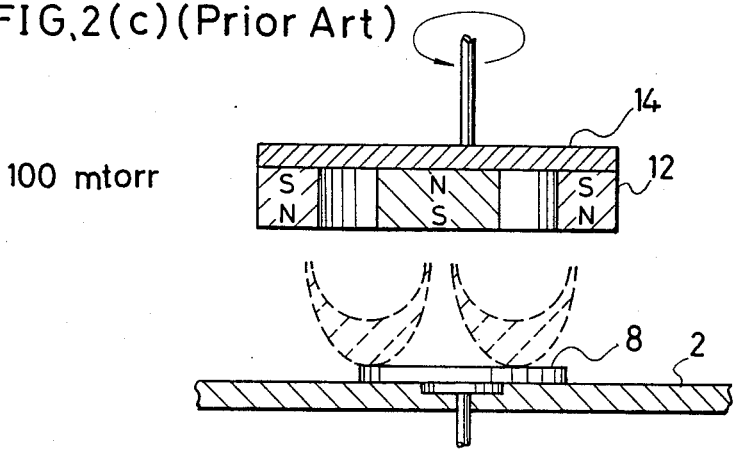

20 mtorr 50 mtorr 100 mtorr

DRY-ETCHING APPARATUS

BACKGROUND OF THE INVENTION

1. Field of the Invention

The present invention relates to a dry-etching apparatus to be used for manufacturing electronic devices such as semiconductor devices.

2. Description of the Related Art

Recently, along with an increase of integration of semiconductor devices, dry-etching technology is becoming important basic art to the manufacturing of electronic devices.

A conventional planar (parallel electrode) type dry-etching apparatus has a problem that plasma density in the reaction gas is of low level. For example, in a dry-etching of silicon oxide film, the conventional planar type configuration cannot achieve a high enough etching rate, and it is inefficient in productivity.

For the reason as described above, as a means for resolving the problem, a report has been made on the development of a magnetron dry-etching apparatus. [Extended Abstracts (The 34th Spring Meeting, 1987), The Japan Society of Applied Physics and Related Societies, page 455]

Referring now to the operating principle of the conventional magnetron dry-etching apparatus, a reaction gas is provided under fixed pressure in an etching chamber and R.F. power (Radio Frequency electromagnetic wave power) is supplied into the etching chamber. The, the reaction gas is excited into a plasma gas. When a magnetic field is applied to the plasma gas, the electrons are trapped by and move by revolving along the magnetic flux.

Therefore, the path length of electrons increases on account of the revolving motion. Accordingly, collisions of electrons with neutral reaction gas atoms or molecules increase, thereby increasing the plasma density. The etching rate can be greatly increased by the increase of the plasma density in comparison with the planar type dry-etching apparatus.

Thus, the magnetron dry-etching apparatus has an advantage of increasing the etching rate through an increase of plasma density. But, the problem in the magnetron dry-etching apparatus is difficulty of uniform application of the magnetic field on a workpiece substrate. Therefore, the conventionally made devices have a problem that the etching cannot be made uniformly.

Recently, a way of making a uniform magnetic field on a principal face of an object substrate has been provided. This is accomplished by installing a permanent magnet of concentrical polarization. The permanent magnet is rotated behind an anode electrode in an etching chamber, in a manner so as to be rotated by a motor in eccentric manner along an axis offset from its center.

FIG. 1a and FIG. 1b are each views showing the arrangement of the conventional permanent magnet.

FIG. 1c is a graph showing the distribution of etching rates on workpiece substrates, taking pressures in the etching chamber as a parameter, of the workpiece substrates etched by the eccentrically driven permanent magnet shown in FIG. a and FIG. 1b. The etching is carried out under the following conditions.

Reaction gas: $CHF_3$ 45 sccm: $O_2$ 5 sccm
R.F. power: 450 W
Workpiece substrate: silicon oxide film on a silicon wafer of 6 inch diameter The results shown in FIG. 1c are obtained under the following conditions: Under 50 mtorr in an etching chamber, the eccentric position for rotation of the permanent magnet is adjusted so that it provides a uniform etching rate on the surface of a workpiece substrate. However, it is apparent from FIG. 1c that: etching rates are different between a central part and peripheral parts of the wafer, corresponding to local changes of pressure in the etching chamber. Therefore, it will be understood that uniform etching rates cannot be obtained under pressures of 20 mtorr to 100 mtorr.

FIG. 2a, FIG. 2b, and FIG. 2c schematically show the state of plasma discharge by stopping the permanent magnets shown in FIG. 1a and FIG. 1b. The shaded portions in FIG. 2 are regions of high level plasma density. In the figure, it will be understood that regions of high level plasma density are displaced from peripheral parts toward the center of the wafer as the pressure in the etching chamber increases. This is an important reason for irregular or nonuniform etching due to nonuniformity of plasma density caused by change of pressure.

For the reasons as described above and shown in FIG. 1c, in the conventional configuration of the permanent magnet, distribution of plasma density is much different from one position to another position of the wafer, and the difference (nonuniformity) changes as the etching conditions change, especially as the pressure changes. As a result, whenever the etching conditions are changed, it is necessary to adjust for uniformity of etching rate by changing the arrangement of the permanent magnet, or by readjusting the axis of rotation.

Accordingly, it is the primary object of this invention to provide a dry-etching apparatus which can provide etching with excellent uniformity without any need of adjustment of the permanent magnet arrangement even when the etching conditions are changed. The above object of the present invention is achieved by an improved magnetron dry-etching apparatus which has a specially polarized permanent magnet member with rotation means behind an anode electrode. The special disposition of the permanent magnet is such that plural pairs of oppositely polarized narrow-pie-shaped permanent magnets are disposed in a circular or fan shape. Respective narrow-pie-shaped permanent magnets are disposed by arranging their straight sides adjacent to each other along a radius of the circle; and so on. The poles of the permanent magnets are arranged such that oppositely polarized poles, i.e. N-pole and S-pole form a unit pair disposed side by side along a radii of the circle with their opposite faces connected to a common yoke.

The magnetron etching apparatus in accordance with the present invention thus comprises:

an etching chamber containing a cathode electrode for placing a workpiece substrate thereon, an anode electrode installed in parallel arrangement to the cathode electrode with a gap inbetween, means for applying R.F. power across the cathode electrode and the anode electrode, means for supplying reaction gas to the etching chamber, and means for evacuating the etching chamber to predetermined pressure, a permanent magnet assembly located behind the anode electrode and having means for rotation in a plane parallel to the anode electrode and comprising at least a pair of narrow-pie-shaped permanent magnets fixed to a yoke in a manner such that different polarity magnetic poles are disposed side by side on both sides of a radial line originating from the center of the rotation, with apexes or apices of the narrow-pie-shaped permanent magnets at the center.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

The above and other objects of the invention will be seen by reference to the description taken in connection with the accompanying drawings, in which:

FIG. 2a, FIG. 2b and FIG. 2c are schematic illustrations showing the distribution of plasma density for the conventional permanent magnet.

FIG. 5b is an illustration showing distributions of plasma density for a pair of rectangular permanent magnets shown in FIG. 5a.

DESCRIPTION OF THE PREFERRED EMBODIMENT

In the following, a dry-etching apparatus embodying the present invention is explained with reference to the drawings of FIG. 3 and thereafter.

Figure 3:
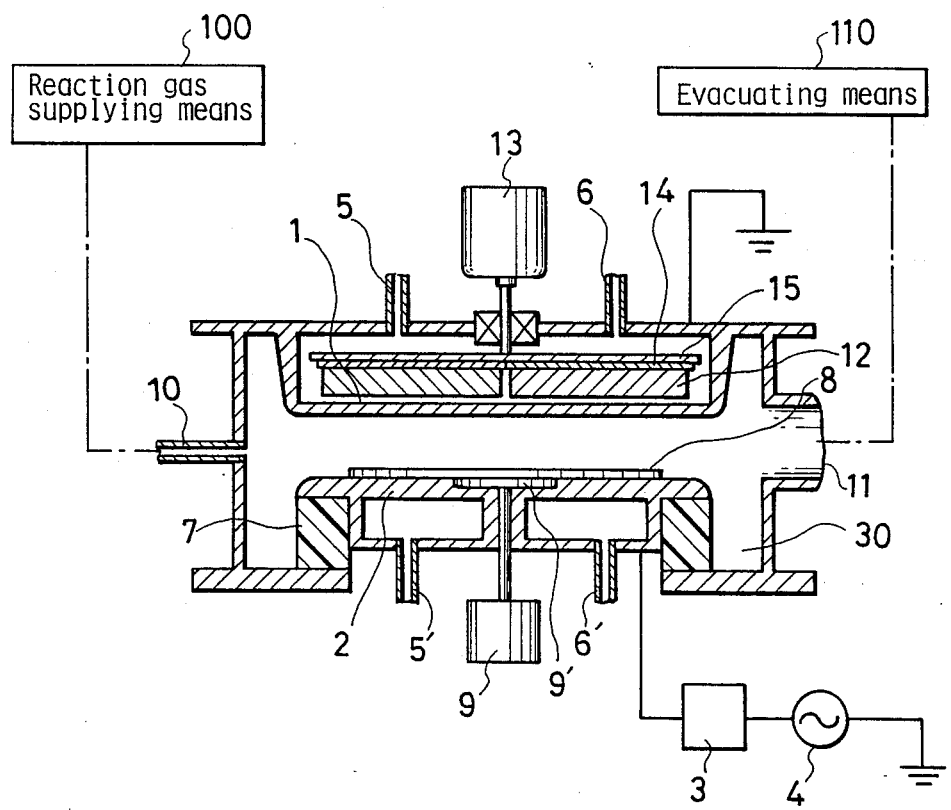
FIG. 3 is a schematic diagram showing an embodiment of the dry-etching apparatus in accordance with the present invention.

FIG. 3 is a schematic diagram showing a dry-etching apparatus embodying embodiments the present invention. In FIG. 3, an anode electrode 1, and a cathode electrode 2 are in an etching chamber 30, the cathode electrode 2 being connected to a matching network 3 and R.F. power (radio frequency electromagnetic wave power) source 4. Respective inlet ports 5, 5' and outlet ports 6, 6' are provided on the etching chamber 30 for flowing a known coolant for cooling the anode electrode 1 and the cathode electrode 2. The cathode electrode 2 is insulted from the etching chamber 30 by an insulator 7. A wafer 8 to be etched on its principal face is placed on the cathode electrode 2. An elevator 9, 9' is provided for moving the wafer 8. A gas inlet port 10 and an exhaust port 11 are provided for feeding in from gas supplying means and exhausting known reaction gas, and the exhaust port 11 is connected to a known evacuating apparatus 110 to maintain a fixed pressure in the etching chamber 30.

A permanent magnet 12 is installed behind the anode electrode 1, and the permanent magnet 12 is mechanically and magnetically coupled to a yoke 14. Yoke 14 is connected to a rotation means, such as an electric motor 13.

Operation of the above-mentioned dry-etching apparatus is as follows:

A known reaction gas is supplied into the etching chamber 30 through the inlet port 10 and maintained at a predetermined pressure. Then, the reaction gas in ionized to form a plasma by R.F. power applied across the anode electrode 1 and the cathode electrode 2. The material which is to be etched and has been coated on the wafer 8 is removed by known physico-chemical reaction of plasma which is ionized reaction gas, and the etching is carried out.

Figure 4A:
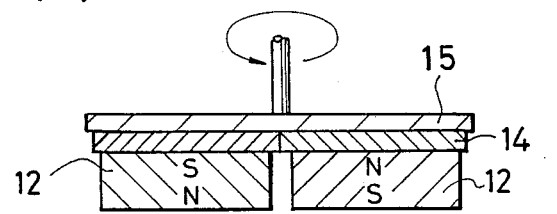
FIG. 4a is a schematic vertical section view of a permanent magnet of the embodiment of FIG. 3.
Figure 4A:
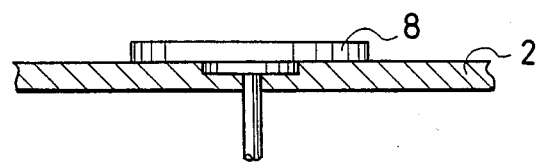
Figure 4B:
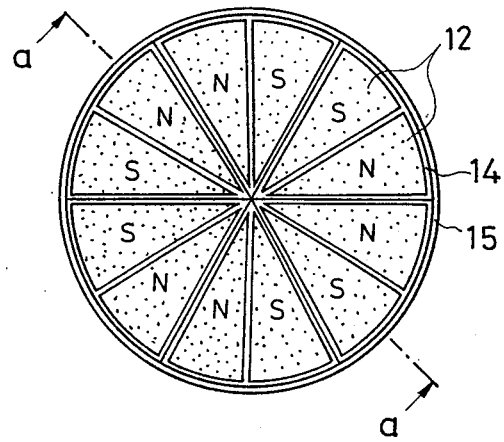
FIG. 4b is a bottom view of a permanent magnet of the embodiment of FIG. 3.
Figure 4C:
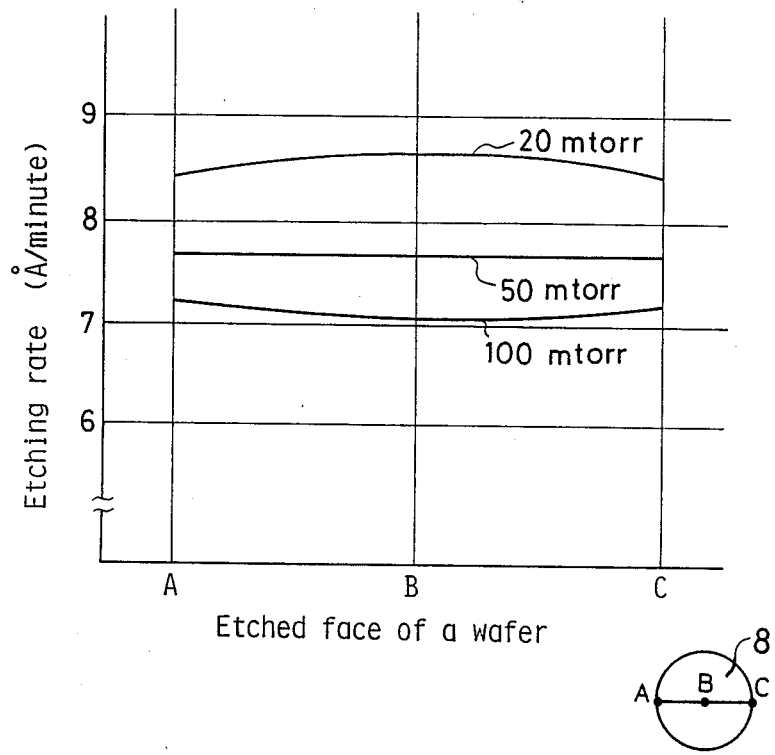
FIG. 4c is a graph showing the variation in etching rate across the etched face of a wafer of the embodiment.
Figure 4C:
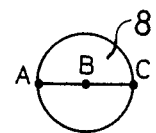

FIG. 4a and FIG. 4b are sectional side view and bottom views, respectively, of the permanent magnets 12, and FIG. 4a is section view along line a-a of FIG. 4b, FIG. 4c is a graph showing the variation of etching rate as a function of etching positions of the wafer 8 in accordance with the present invention. In the embodiment of the present invention, the disk shaped rotating assembly of plural permanent magnets 12 comprises plural pairs of the narrow-pie-shaped permanent magnets 12, 12 . . . . . The apex of each narrow-pie-shaped permanent magnet 12 is arranged at the center of rotation of the assembly. The permanent magnets 12 are disposed to form N-S pairs of magnetic poles, each N-S pair being fixed to a pie-shaped magnetic yoke 14 to form a unit N-S pair. The, one or more of the unit N-S pairs are fixed to a rotatable disk 15 made of a non-magnetic stainless steel by bonding the pie-shaped magnetic yokes 14 thereto. In disposing two or more of the N-S pairs of the magnetic poles, the same kinds of magnetic poles, e.g. N and N, or S and S, of the next N-S pair are preferably disposed side by side, in order to produce strong magnetic flux therebetween.

In the embodiment of the present invention, the permanent magnets 12 are made of a rare earth alloy, which has a strong magnetic flux density at the surface thereof, e.g. about 5 K gauss, and a magnet flux density of about 200 gauss at the surface of the wafer 8 is obtainable. The central angle of each permanent magnet 12 of narrow-pie-shape is 30 degrees, and the rotational speed is 50 rpm.

Figure 1A:
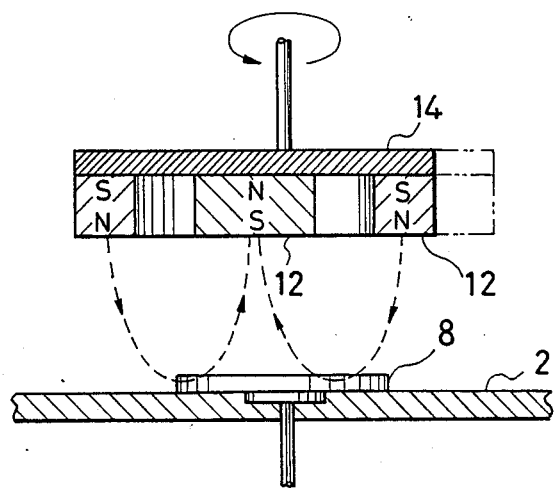
FIG. 1a is a schematic vertical section view of the permanent magnet in the conventional dry-etching apparatus.
Figure 1B:
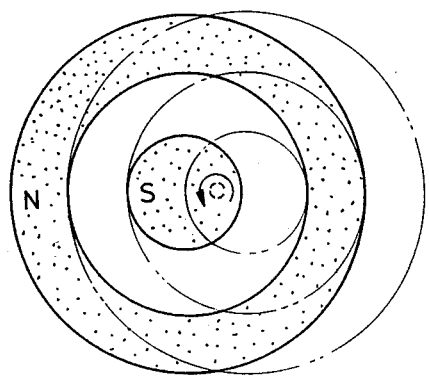
FIG. 1b is a bottom view of the permanent magnet in the conventional dry-etching apparatus.

FIG. 4c is a graph showing the etching rate at each etching position across the wafer 8 obtained by using the permanent magnet 12 shown in FIG. 4a and FIG. 4b. This etching according to the present invention is carried out under similar conditions as described in the prior art of FIG. 1a and FIG. 1b. And, characteristics of the etching rate shown in FIG. 4c correspond to that of FIG. 1c.

Figure 1C:
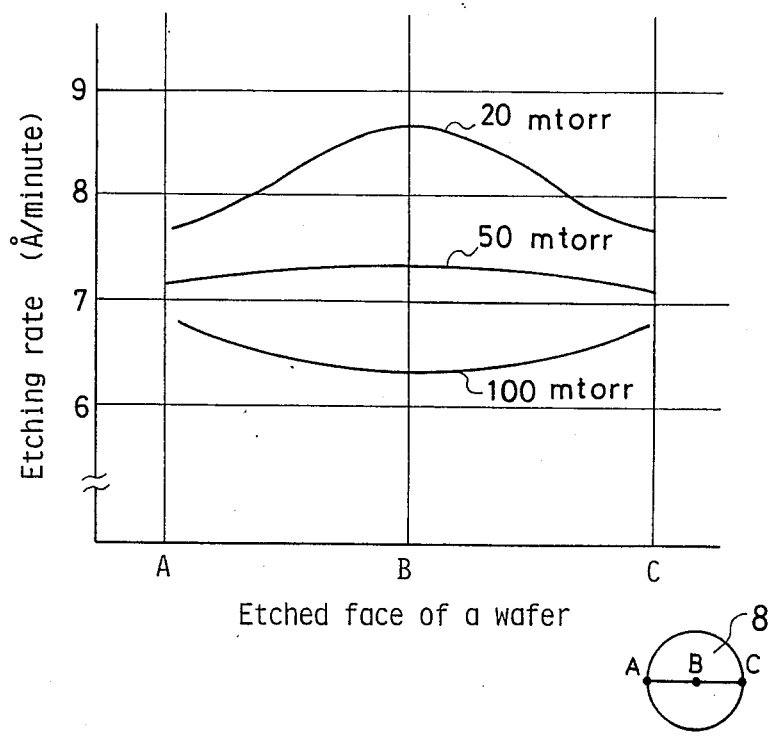
FIG. 1c is a graph showing the variation of etching rate as a function of etching position of the wafer in the conventional dry-etching apparatus.

Comparison of FIG. 4c with FIG. 1c reveals that according to the present invention, a good uniformity of the etching rate with respect to position of the wafer 8 is obtainable even for changes in pressure in the etching chamber 30. The reason for the good uniformity is that, by using a permanent magnet 12 in accordance with the present invention, the change in distribution of plasma density dependent on change in pressure is decreased.

As mentioned above, good etching uniformity becomes obtainable by use of a magnetron dry-etching apparatus with plural paris of the narrow-pie-shaped permanent magnets, irrespective of changes in etching conditions.

The reasons for improvement in etching uniformity by the fan-shaped arrangement of the narrow-pie-shaped permanent magnets is explained with reference to FIG. 5a and 5b as follows.

Figure 5A:
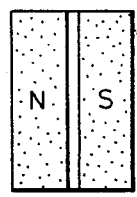
FIG. 5a is an illustration showing a comparison arrangement of a pair of rectangular permanent magnets for comparative explanation of principle.
Figure 5B:
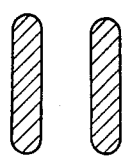
Figure 5B:
Figure 5B:

FIG. 5a and FIG. 5b show the states of change of distribution uniformity of etching rate examined by changing the disposition of a pair of rectangular permanent magnets. FIG. 5a shows an arrangement of the pair of rectangular permanent magnets. A pair of rectangular permanent magnets is installed in the dry-etching apparatus of the present invention shown in FIG. 3. FIG. 5b illustrates the pressure dependency of distribution of etching rate.

The shaded portions of FIG. 5b show regions of high etching rate. As FIG. 5b shows, with the pressure below 20 mtorr the regions of high etching rate are substantially under each N-pole and S-pole of the permanent magnets, but with an increase in the pressure from 20 mtorr to 100 mtorr the high level regions become closer to each other in the area beneath the N-pole and S-pole. Finally, with a pressure above 100 mtorr, the high level regions merge into one region. As mentioned above, the distribution of etching rate changes with pressure in the etching chamber 30 corresponding to changes in the regions of high plasma density. As a result, the high level regions shift depending on the etching conditions as shown in FIG. 5b, shifting laterally of the lengthwise direction of the permanent magnets. From the above-mentioned observation, the effect on uniformity of etching rate depending on etching conditions (gas pressure) can be suppressed by providing rectangular or oblong N-pole and S-pole permanent magnets in the radial direction of a disk, which is rotated above the wafer to be etched.

In other words, by disposing gaps between a pair of permanent magnet poles in the radial direction of a rotating disk-shaped magnet assembly, even though the gas pressure of the etching chamber changes, the distribution of magnetic field over the object wafer can be kept uniform by rotation of the disk-shaped magnet assembly.

While the hitherto existed shifting of magnetic field has been prevented by the above-mentioned configuration of disposing the permanent magnet gaps in radial directions of the rotating disk shaped assembly, another nonuniformity may exist in the radial direction. That is, because the relative velocity of the pole gap above the object wafer is much faster near the peripheral region than the central region of the wafer, if simple rectangular shaped permanent magnets are used to make the assembly, the central region has too strong a magnetic field while the peripheral region has too weak a magnetic field. Such nonuniformity of the magnet field in the radial direction is compensated by forming each element permanent magnet in narrow-pie-shape. Thereby, the central region has a smaller width of the permanent magnet while the peripheral region has a larger width. Furthermore, if more detailed local adjustment of the magnetic field strength if necessary, that can be made by way of magnetization processes known to the art.

In the above-mentioned embodiment, the problem of obtaining uniformity of distribution of etching rate has been discussed for changes of pressure. However, the above-mentioned configuration of the present invention has also been effective for changes of R.F. power and other parameters.

Apart from the above-mentioned embodiment where plural pairs of narrow-pie-shaped permanent magnets of different poles are used in configuring the rotating magnet assembly, a modified embodiment can be formed by using only one pair of narrow-pie-shaped permanent magnets.

It will be apparent from the embodiment as described above that, in the magnetron dry-etching apparatus, by comprising one or a plural pair of narrow-pie-shaped permanent magnets on a rotating means, each pair having different polarity magnetic poles aligned side-by-side, a good uniformity of etching is obtainable even for changes in etching conditions.

While the invention has been described in connection with what is presently considered to be the most practical and preferred embodiment, it is to be understood that the invention is not to be limited to the disclosed embodiment, but on the contrary is intended to cover various modifications and equivalent arrangements included within the spirit and scope of the appended claims.

What is claimed is:

1. A dry-etching apparatus comprising;
    an etching chamber containing a cathode electrode for placing a workpiece substrate thereon,
    an anode electrode installed in parallel arrangement to said cathode electrode with a gap inbetween,
    means for applying R. F. power across said cathode electrode and said anode electrode,
    means for supplying reaction gas to said etching chamber, and
    means for evacuating said etching chamber to predetermined pressure,
    a rotary permanent magnet assembly located behind said anode electrode and having means for rotation in a plane parallel to said anode electrode and comprising a plurality of pairs of narrow-pie-shaped permanent magnets fixed to a yoke in a manner such that different polarity magnetic poles are disposed side by side on both sides of a radial line originating from the center of said rotation, with the apexes of said narrow-pie-shaped permanent magnets at the center, a plurality of pairs of said narrow-pie-shaped permanent magnets being arranged in a manner such that the same polarity magnetic poles of adjacent pairs are disposed side by side on said yoke.

* * * * *